(12) United States Patent
Honea et al.

(10) Patent No.: US 9,866,210 B2
(45) Date of Patent: Jan. 9, 2018

(54) BRIDGE CIRCUITS AND THEIR COMPONENTS

(71) Applicant: Transphorm Inc., Goleta, CA (US)

(72) Inventors: James Honea, Santa Barbara, CA (US); Yifeng Wu, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 13 days.

(21) Appl. No.: 14/539,098

(22) Filed: Nov. 12, 2014

(65) Prior Publication Data

US 2015/0070076 A1    Mar. 12, 2015

Related U.S. Application Data

(63) Continuation of application No. 13/887,204, filed on May 3, 2013, now Pat. No. 8,912,839, which is a continuation of application No. 13/164,109, filed on Jun. 20, 2011, now Pat. No. 8,508,281, which is a continuation of application No. 12/368,200, filed on Feb. 9, 2009, now Pat. No. 7,965,126.

(60) Provisional application No. 61/028,133, filed on Feb. 12, 2008.

(51) Int. Cl.
| | |
|---|---|
| H03K 17/56 | (2006.01) |
| H03K 17/0814 | (2006.01) |
| H03K 17/16 | (2006.01) |
| H03K 17/567 | (2006.01) |
| H03K 17/687 | (2006.01) |
| H03K 17/22 | (2006.01) |

(52) U.S. Cl.
CPC ..... *H03K 17/08142* (2013.01); *H03K 17/162* (2013.01); *H03K 17/223* (2013.01); *H03K 17/567* (2013.01); *H03K 17/6871* (2013.01)

(58) Field of Classification Search
CPC ........... H03K 17/08142; H03K 17/162; H03K 17/223; H03K 17/567; H03K 17/6871
See application file for complete search history.

(56) References Cited

U.S. PATENT DOCUMENTS

| | | |
|---|---|---|
| 3,767,946 A | 10/1973 | Berger et al. |
| 4,384,287 A | 5/1983 | Sakuma |
| 4,665,316 A | 5/1987 | Hodges |
| 4,728,826 A | 3/1988 | Einzinger et al. |

(Continued)

FOREIGN PATENT DOCUMENTS

| | | |
|---|---|---|
| CN | 1320298 | 10/2001 |
| CN | 1682445 | 10/2005 |

(Continued)

OTHER PUBLICATIONS

Notice of Reasons for Rejection in JP Application No. 2014-219833, dated Jan. 5, 2016, 16 pages.

(Continued)

*Primary Examiner* — Ryan Jager
(74) *Attorney, Agent, or Firm* — Fish & Richardson P.C.

(57) ABSTRACT

A half bridge is described with at least one transistor having a channel that is capable in a first mode of operation of blocking a substantial voltage in at least one direction, in a second mode of operation of conducting substantial current in one direction through the channel and in a third mode of operation of conducting substantial current in an opposite direction through the channel. The half bridge can have two circuits with such a transistor.

38 Claims, 12 Drawing Sheets

(56) References Cited

U.S. PATENT DOCUMENTS

| | | | |
|---|---|---|---|
| 4,808,853 A | 2/1989 | Taylor | |
| 5,198,964 A | 3/1993 | Ito et al. | |
| 5,379,209 A | 1/1995 | Goff | |
| 5,493,487 A | 2/1996 | Close et al. | |
| 5,637,922 A | 6/1997 | Fillion et al. | |
| 5,677,602 A * | 10/1997 | Paul | H05B 41/2881 315/224 |
| 5,952,856 A | 9/1999 | Horiguchi et al. | |
| 6,008,684 A | 12/1999 | Ker et al. | |
| 6,107,844 A | 8/2000 | Berg et al. | |
| 6,130,831 A | 10/2000 | Matsunaga | |
| 6,172,550 B1 | 1/2001 | Gold et al. | |
| 6,333,617 B1 | 12/2001 | Itabashi et al. | |
| 6,395,593 B1 | 5/2002 | Pendharkar et al. | |
| 6,434,019 B2 | 8/2002 | Baudelot et al. | |
| 6,521,940 B1 | 2/2003 | Vu et al. | |
| 6,650,169 B2 | 11/2003 | Faye et al. | |
| 6,781,423 B1 | 8/2004 | Knoedgen | |
| 6,856,520 B2 * | 2/2005 | Neilson | H01L 29/7395 257/E29.198 |
| 6,900,657 B2 | 5/2005 | Bui et al. | |
| 7,116,567 B2 | 10/2006 | Shelton et al. | |
| 7,304,331 B2 | 12/2007 | Saito et al. | |
| 7,378,883 B1 | 5/2008 | Hsueh | |
| 7,443,648 B2 | 10/2008 | Cutter et al. | |
| 7,449,730 B2 | 11/2008 | Kuraguchi | |
| 7,477,082 B2 | 1/2009 | Fukazawa | |
| 7,501,669 B2 | 3/2009 | Parikh et al. | |
| 7,548,112 B2 | 6/2009 | Sheppard | |
| 7,612,602 B2 | 11/2009 | Yang et al. | |
| 7,639,064 B2 | 12/2009 | Hsiao et al. | |
| 7,714,360 B2 | 5/2010 | Otsuka et al. | |
| 7,719,055 B1 | 5/2010 | McNutt et al. | |
| 7,746,020 B2 | 6/2010 | Schnetzka et al. | |
| 7,755,108 B2 | 7/2010 | Kuraguchi | |
| 7,795,642 B2 | 9/2010 | Suh et al. | |
| 7,804,328 B2 | 9/2010 | Pentakota et al. | |
| 7,851,825 B2 | 12/2010 | Suh et al. | |
| 7,855,401 B2 | 12/2010 | Sheppard et al. | |
| 7,875,907 B2 | 1/2011 | Honea et al. | |
| 7,875,914 B2 | 1/2011 | Sheppard | |
| 7,884,394 B2 | 2/2011 | Wu et al. | |
| 7,884,395 B2 | 2/2011 | Saito | |
| 7,898,004 B2 | 3/2011 | Wu et al. | |
| 7,906,837 B2 | 3/2011 | Cabahug et al. | |
| 7,915,643 B2 | 3/2011 | Suh et al. | |
| 7,920,013 B2 | 4/2011 | Sachdev et al. | |
| 7,939,391 B2 | 5/2011 | Suh et al. | |
| 7,965,126 B2 | 6/2011 | Honea et al. | |
| 8,013,580 B2 | 9/2011 | Cervera et al. | |
| 8,138,529 B2 | 3/2012 | Wu | |
| 8,193,562 B2 | 6/2012 | Suh et al. | |
| 8,237,198 B2 | 8/2012 | Wu et al. | |
| 8,289,065 B2 | 10/2012 | Honea et al. | |
| 8,299,737 B2 * | 10/2012 | Morita | H02P 27/08 257/192 |
| 8,344,424 B2 | 1/2013 | Suh et al. | |
| 8,389,977 B2 | 3/2013 | Chu et al. | |
| 8,390,000 B2 | 3/2013 | Chu et al. | |
| 8,455,931 B2 | 6/2013 | Wu | |
| 8,493,129 B2 | 7/2013 | Honea et al. | |
| 8,508,281 B2 | 8/2013 | Honea et al. | |
| 8,519,438 B2 | 8/2013 | Mishra et al. | |
| 8,531,232 B2 | 9/2013 | Honea et al. | |
| 8,541,818 B2 | 9/2013 | Wu et al. | |
| 8,592,974 B2 | 11/2013 | Wu | |
| 8,598,937 B2 | 12/2013 | Lal et al. | |
| 8,624,662 B2 | 1/2014 | Parikh et al. | |
| 8,633,518 B2 | 1/2014 | Suh et al. | |
| 8,643,062 B2 | 2/2014 | Parikh et al. | |
| 8,648,643 B2 | 2/2014 | Wu | |
| 8,692,294 B2 | 4/2014 | Chu et al. | |
| 8,716,141 B2 | 5/2014 | Dora et al. | |
| 8,742,459 B2 | 6/2014 | Mishra et al. | |
| 8,742,460 B2 | 6/2014 | Mishra et al. | |
| 8,772,842 B2 | 7/2014 | Dora | |
| 8,786,327 B2 | 7/2014 | Honea et al. | |
| 8,803,246 B2 | 8/2014 | Wu et al. | |
| 8,816,497 B2 | 8/2014 | Wu | |
| 8,816,751 B2 | 8/2014 | Honea et al. | |
| 8,841,702 B2 | 9/2014 | Mishra et al. | |
| 8,860,495 B2 | 10/2014 | Lal et al. | |
| 8,895,421 B2 | 11/2014 | Parikh et al. | |
| 8,895,423 B2 | 11/2014 | Dora | |
| 9,178,412 B2 * | 11/2015 | Kawashima | H02M 1/4208 |
| 9,379,620 B2 * | 6/2016 | Zhang | H02M 3/33507 |
| 2002/0125920 A1 | 9/2002 | Stanley | |
| 2002/0153938 A1 | 10/2002 | Baudelot et al. | |
| 2003/0178654 A1 | 9/2003 | Thornton | |
| 2004/0100303 A1 * | 5/2004 | Congdon | H03K 17/04123 326/81 |
| 2004/0178831 A1 | 9/2004 | Li et al. | |
| 2005/0052221 A1 | 3/2005 | Kohnotoh et al. | |
| 2005/0067716 A1 | 3/2005 | Mishra et al. | |
| 2005/0077947 A1 | 4/2005 | Münzer et al. | |
| 2005/0146310 A1 | 7/2005 | Orr | |
| 2005/0189561 A1 * | 9/2005 | Kinzer | H01L 27/0605 257/192 |
| 2005/0189562 A1 | 9/2005 | Kinzer et al. | |
| 2005/0218964 A1 | 10/2005 | Oswald et al. | |
| 2006/0033122 A1 | 2/2006 | Pavier et al. | |
| 2006/0043499 A1 | 3/2006 | De Cremoux et al. | |
| 2006/0044849 A1 | 3/2006 | Siljestrom et al. | |
| 2006/0060871 A1 | 3/2006 | Beach | |
| 2006/0102929 A1 | 5/2006 | Okamoto et al. | |
| 2006/0108605 A1 | 5/2006 | Yanagihara et al. | |
| 2006/0115242 A1 | 6/2006 | Kameda | |
| 2006/0176007 A1 | 8/2006 | Best | |
| 2006/0237825 A1 | 10/2006 | Pavier et al. | |
| 2006/0238234 A1 | 10/2006 | Benelbar et al. | |
| 2006/0261473 A1 | 11/2006 | Connah et al. | |
| 2006/0267541 A1 * | 11/2006 | Battello | H02P 6/085 318/801 |
| 2007/0018210 A1 | 1/2007 | Sheppard | |
| 2007/0080672 A1 | 4/2007 | Yang | |
| 2007/0090373 A1 | 4/2007 | Beach et al. | |
| 2007/0146045 A1 | 6/2007 | Koyama | |
| 2007/0210329 A1 | 9/2007 | Goto | |
| 2007/0228416 A1 * | 10/2007 | Chen | H01L 21/8252 257/192 |
| 2007/0278518 A1 | 12/2007 | Chen et al. | |
| 2008/0017998 A1 | 1/2008 | Pavio | |
| 2008/0018366 A1 | 1/2008 | Hanna | |
| 2008/0121876 A1 | 5/2008 | Otsuka et al. | |
| 2008/0122418 A1 | 5/2008 | Briere et al. | |
| 2008/0136390 A1 | 6/2008 | Briere | |
| 2008/0158110 A1 | 7/2008 | Iida et al. | |
| 2008/0191342 A1 | 8/2008 | Otremba | |
| 2008/0203559 A1 | 8/2008 | Lee et al. | |
| 2008/0230784 A1 * | 9/2008 | Murphy | H01L 27/0605 257/76 |
| 2008/0248634 A1 | 10/2008 | Beach | |
| 2008/0272404 A1 | 11/2008 | Kapoor | |
| 2008/0283844 A1 | 11/2008 | Hoshi et al. | |
| 2009/0032879 A1 | 2/2009 | Kuraguchi | |
| 2009/0050936 A1 | 2/2009 | Oka | |
| 2009/0072269 A1 | 3/2009 | Suh et al. | |
| 2009/0135636 A1 | 5/2009 | Kuzumaki et al. | |
| 2009/0167411 A1 | 7/2009 | Machida et al. | |
| 2009/0180304 A1 | 7/2009 | Bahramian et al. | |
| 2009/0201072 A1 | 8/2009 | Honea et al. | |
| 2009/0215230 A1 | 8/2009 | Muto et al. | |
| 2009/0218598 A1 | 9/2009 | Goto | |
| 2009/0236728 A1 | 9/2009 | Satou et al. | |
| 2009/0278513 A1 | 11/2009 | Bahramian et al. | |
| 2009/0315594 A1 | 12/2009 | Pentakota et al. | |
| 2010/0067275 A1 | 3/2010 | Wang et al. | |
| 2010/0073067 A1 | 3/2010 | Honea | |
| 2010/0097119 A1 | 4/2010 | Ma et al. | |
| 2010/0117095 A1 | 5/2010 | Zhang | |
| 2010/0127652 A1 | 5/2010 | Morita et al. | |
| 2011/0019450 A1 | 1/2011 | Callanan et al. | |
| 2011/0025397 A1 | 2/2011 | Wang et al. | |
| 2011/0121314 A1 | 5/2011 | Suh et al. | |

(56) References Cited

U.S. PATENT DOCUMENTS

| | | |
|---|---|---|
| 2011/0169549 A1 | 7/2011 | Wu |
| 2011/0249477 A1 | 10/2011 | Honea et al. |
| 2013/0249622 A1 | 9/2013 | Honea et al. |

FOREIGN PATENT DOCUMENTS

| | | |
|---|---|---|
| CN | 101978589 | 2/2011 |
| CN | 102165694 | 8/2011 |
| CN | 102308387 | 1/2012 |
| CN | 103477543 | 12/2013 |
| EP | 1 557 948 | 7/2005 |
| EP | 2 006 991 | 12/2008 |
| EP | 2 188 842 | 5/2010 |
| EP | 2 243 213 | 10/2010 |
| EP | 2 394 303 | 12/2011 |
| JP | 4-165963 | 6/1992 |
| JP | 5-075040 | 3/1993 |
| JP | 6-067744 | 3/1994 |
| JP | 2000-101356 | 4/2000 |
| JP | 2000-124358 | 4/2000 |
| JP | 2003-244943 | 8/2003 |
| JP | 2003-338742 | 11/2003 |
| JP | 2004-147472 | 5/2004 |
| JP | 2004-281454 | 10/2004 |
| JP | 2005-012051 | 1/2005 |
| JP | 2005-210891 | 8/2005 |
| JP | 2006-033723 | 2/2006 |
| JP | 2006-115557 | 4/2006 |
| JP | 2006-115598 | 4/2006 |
| JP | 2006-149090 | 6/2006 |
| JP | 2006-158185 | 6/2006 |
| JP | 2006-173754 | 6/2006 |
| JP | 2007-036218 | 2/2007 |
| JP | 2007-096203 | 4/2007 |
| JP | 2007-143229 | 6/2007 |
| JP | 2007-159278 | 6/2007 |
| JP | 2007-215331 | 8/2007 |
| JP | 2007-215389 | 8/2007 |
| JP | 2007-252005 | 9/2007 |
| JP | 2007-294769 | 11/2007 |
| JP | 2008-199771 | 8/2008 |
| JP | 2009-159812 | 7/2009 |
| JP | 2010-539712 | 12/2010 |
| JP | 2011-512119 | 4/2011 |
| JP | 2012-517699 | 8/2012 |
| TW | 200601578 | 1/2006 |
| TW | 1257172 | 6/2006 |
| TW | 200618252 | 6/2006 |
| TW | 200742079 | 11/2007 |
| TW | 200941920 | 10/2009 |
| TW | 201027912 | 7/2010 |
| TW | 201036155 | 10/2010 |
| TW | 201126686 | 8/2011 |
| TW | 201143017 | 12/2011 |
| TW | 201332085 | 8/2013 |
| TW | 201347143 | 11/2013 |
| WO | WO 2006/060337 | 6/2006 |
| WO | WO 2009/036266 | 3/2009 |
| WO | WO 2009/102732 | 8/2009 |
| WO | WO 2010/039463 | 4/2010 |
| WO | WO 2010/090885 | 8/2010 |
| WO | WO 2011/053981 | 5/2011 |
| WO | WO 2011/085260 | 7/2011 |
| WO | WO 2011/097302 | 8/2011 |
| WO | WO 2013/085839 | 6/2013 |

OTHER PUBLICATIONS

Official Letter in TW Application No. 103136677, dated Mar. 1, 2016, 23 pages.
U.S. Appl. No. 11/856,695, filed Sep. 17, 2007, Gallium Nitride Diodes and Integrated Components.
U.S. Appl. No. 14/108,642, filed Dec. 17, 2013, Gallium Nitride Power Devices.
U.S. Appl. No. 60/971,721, filed Sep. 12, 2007, III-Nitride Bilateral Switches.
U.S. Appl. No. 60/972,467, filed Sep. 14, 2007, Growing N-Polar III-Nitride Structures.
U.S. Appl. No. 12/209,504, filed Sep. 12, 2008, Growing N-Polar III-Nitride Structures.
U.S. Appl. No. 60/972,481, filed Sep. 14, 2007, III-Nitride Devices with Recessed Gates.
U.S. Appl. No. 60/012,755, filed Dec. 10, 2007, Insulated Gate E-Mode Transistors.
U.S. Appl. No. 61/028,133, filed Feb. 12, 2008, Bridge Circuits and their Components.
U.S. Appl. No. 13/887,204, filed May 3, 2013, Bridge Circuits and their Components.
U.S. Appl. No. 14/464,639, filed Aug. 20, 2014, Enhancement Mode III-N HEMTs.
U.S. Appl. No. 61/099,451, filed Sep. 23, 2008, Inductive Load Power Switching Circuits.
U.S. Appl. No. 14/332,967, filed Jul. 16, 2014, Inductive Load Power Switching Circuits.
U.S. Appl. No. 13/973,890, filed Aug. 22, 2013, Semiconductor Heterostructure Diodes.
U.S. Appl. No. 14/063,438, filed Oct. 25, 2013, Package Configurations for Low EMI Circuits.
U.S. Appl. No. 13/756,284, filed Jan. 31, 2013, Methods of Forming Reverse Side Engineered Iii-Nitride Devices.
U.S. Appl. No. 14/262,649, filed Apr. 25, 2014, High Voltage III-Nitride Semiconductor Devices.
U.S. Appl. No. 14/178,701, filed Feb. 12, 2014, Semiconductor Devices with Field Plates.
U.S. Appl. No. 14/336,287, filed Jul. 21, 2014, Electronic Devices and Components for High Efficiency Power Circuits.
U.S. Appl. No. 14/058,089, filed Oct. 18, 2013, Semiconductor Electronic Components and Circuits.
U.S. Appl. No. 14/260,808, filed Apr. 24, 2014, Transistors with Isolated Regions.
U.S. Appl. No. 12/953,769, filed Nov. 24, 2010, Layer Structures for Controlling Stress of Heteroepitaxially Grown III-Nitride Layers.
U.S. Appl. No. 13/226,380, filed Sep. 6, 2011, Semiconductor Devices with Guard Rings.
U.S. Appl. No. 14/530,204, filed Oct. 31, 2014, Semiconductor Devices with Guard Rings.
U.S. Appl. No. 14/522,154, filed Oct. 23, 2014, III-N Device Structures and Methods.
U.S. Appl. No. 14/524,299, filed Oct. 27, 2014, Semiconductor Diodes with Low Reverse Bias Currents.
U.S. Appl. No. 14/211,104, filed Mar. 14, 2014, Electrode Configurations for Semiconductor Devices.
U.S. Appl. No. 61/477,519, filed Sep. 28, 2011, Electronic Components with Reactive Filters.
U.S. Appl. No. 14/307,234, filed Jun. 17, 2014, Method of Forming Electronic Components with Reactive Filters.
U.S. Appl. No. 61/568,022, filed Dec. 7, 2011, Semiconductor Modules and Methods of Forming the Same.
U.S. Appl. No. 13/690,103, filed Nov. 30, 2012, Semiconductor Modules and Methods of Forming the Same.
U.S. Appl. No. 13/366,090, filed Feb. 3, 2012, Buffer Layer Structures Suited for III-Nitride Devices with Foreign Substrates.
U.S. Appl. No. 14/134,878, filed Dec. 19, 2013, Semiconductor Power Modules and Devices.
U.S. Appl. No. 61/621,956, filed Apr. 9, 2012, N-Polar III-Nitride Transistors.
U.S. Appl. No. 13/859,635, filed Apr. 9, 2013, N-Polar III-Nitride Transistors.
U.S. Appl. No. 61/765,635, filed Feb. 15, 2013, Electrodes for Semiconductor Devices and Methods of Forming the Same.
U.S. Appl. No. 14/179,788, filed Feb. 13, 2014, Electrodes for Semiconductor Devices and Methods of Forming the Same.
U.S. Appl. No. 61/791,395, filed Mar. 15, 2013, Carbon Doping Semiconductor Devices.
U.S. Appl. No. 14/208,304, filed Mar. 13, 2014, Carbon Doping Semiconductor Devices.

(56) References Cited

OTHER PUBLICATIONS

U.S. Appl. No. 13/799,989, filed Mar. 13, 2013, Enhancement-Mode III-Nitride Devices.
U.S. Appl. No. 61/807,258, filed Apr. 1, 2013, Gate Drivers for Circuits Based on Semiconductor Devices.
U.S. Appl. No. 14/222,992, filed Mar. 24, 2014, Gate Drivers for Circuits Based on Semiconductor Devices.
U.S. Appl. No. 61/844,260, filed Jul. 9, 2013, Multilevel Inverters and their Components.
U.S. Appl. No. 14/321,269, filed Jul. 1, 2014, Multilevel Inverters and their Components.
U.S. Appl. No. 61/856,573, filed Jul. 19, 2013, III-Nitride Transistor Including a P-Type Depleting Layer.
U.S. Appl. No. 14/327,371, filed Jul. 9, 2014, III-Nitride Transistor Including a P-Type Depleting Layer.
U.S. Appl. No. 14/208,482, filed Mar. 13, 2014, Carbon Doping Semiconductor Devices.
U.S. Appl. No. 13/231,308, filed Sep. 13, 2011, III-N Device Structures Having a Non-Insulating Substrate.
U.S. Appl. No. 14/478,504, filed Sep. 5, 2014, Method of Forming Electronic Components with Increased Reliability.
U.S. Appl. No. 13/535,094, filed Jun. 27, 2012, Semiconductor Devices with Integrated Hole Collectors.
U.S. Appl. No. 14/311,600, filed Jun. 23, 2014, Semiconductor Electronic Components with Integrated Current Limiters.
U.S. Appl. No. 13/551,094, filed Jul. 17, 2012, Contacts for Semiconductor Devices and Methods of Forming the Same.
U.S. Appl. No. 61/672,723, filed Jul. 17, 2012, Devices and Components for Power Conversion Circuits.
U.S. Appl. No. 13/803,912, filed Mar. 14, 2013, Devices and Components for Power Conversion Circuits.
U.S. Appl. No. 14/323,777, filed Jul. 3, 2014, Switching Circuits Having Ferrite Beads.
Authorized officer Keon Hyeong Kim, International Search Report and Written Opinion in PCT/US2008/076160 dated Mar. 18, 2009, 11 pages.
Authorized officer Simin Baharlou, International Preliminary Report on Patentability in PCT/US2008/076160, dated Mar. 25 2010, 6 pages.
Authorized officer Jae Woo Wee, International Search Report and Written Opinion in PCT/US2009/033699, dated Sep. 21, 2009, 11 pages.
Authorized officer Dorothée Mülhausen, International Preliminary Report on Patentability in PCT/US2009/033699, dated Aug. 26, 2010, 6 pages.
Authorized officer Sung Hee Kim, International Search Report and the Written Opinion in PCT/US2009/057554, dated May 10, 2010, 13 pages.
Authorized Officer Gijsbertus Beijer, International Preliminary Report on Patentability in PCT/US2009/057554, dated Mar. 29, 2011, 7 pages.
Authorized officer Sung Chan Chung, International Search Report and Written Opinion for PCT/US2010/021824, dated Aug. 23, 2010, 9 pages.
Authorized officer Beate Giffo-Schmitt, International Preliminary Report on Patentability in PCT/US2010/021824, dated Aug. 18, 2011, 6 pages.
Authorized officer Bon Gyoung Goo, International Search Report and Written Opinion in PCT/US2010/055129, dated Jul. 1, 2011, 11 pages.
Authorized officer Yolaine Cussac, International Preliminary Report on Patentability in PCT/US2010/055129, dated May 18, 2012, 6 pages.
Authorized officer Sung Joon Lee, International Search Report and Written Opinion in PCT/US2011/020592, dated Sep. 19, 2011, 9 pages.
Authorized officer Philippe Bécamel, International Preliminary Report on Patentability in PCT/US2011/020592, dated Jul. 19, 2012, 7 pages.
Authorized officer Kee Young Park, International Search Report and Written Opinion in PCT/US2011/023485, dated Sep. 23 2011, 10 pages.
Authorized officer Nora Lindner, International Preliminary Report on Patentability in PCT/US2011/023485, dated Aug. 16, 2012, 7 pages.
Authorized officer Kwak In Gu, International Search Report and Written Opinion in PCT/US2012/026810, dated Jan. 23, 2013, 10 pages.
Authorized officer Lingfei Bai, International Preliminary Report on Patentability in PCT/US2012/026810, dated Sep. 12, 2013, 6 pages.
European Search Report in Application No. 09 71 0449.1, dated Jun. 27, 2014, 4 pages.
Search Report and Action in TW Application No. 098132132, dated Dec. 6, 2012, 8 pages.
Search Report and Action in TW Application No. 098104543, dated Feb. 24, 2014, 8 pages.
Chinese Third Office Action in Application No. 200980110230.0, dated Jan. 24, 2014, 18 pages.
Chinese Fourth Office Action in Application No. 200980110230.0, dated Jul. 14, 2014, 12 pages.
Japanese Office action in Application No. 2010-546867, dated Sep. 24, 2013, 14 pages.
Notice of Reasons for Rejection in Japanese Application No. JP 2010-546867, dated Jul. 29, 2014, 5 pages.
Chen et al., "Single-Chip Boost Converter Using Monolithically Integrated AlGan/GaN Lateral Field-Effect Rectifier and Normally Off HEMT," IEEE Electron Device Letters, May 2009, 30(5):430-432.
Huselstein et al., "Use of the MOSFET Channel Reverse Conduction in an Inverter for Suppression of the Integral Diode Recovery Current," 1993, The European Power Electronics Association, pp. 431-436.
Napierala et al., "Selective GaN Epitaxy on Si(111) Substrates Using Porous Aluminum Oxide Buffer Layers," Journal of the Electrochemical Society, 2006. 153(2):G125-G127, 4 pages.
Wu et al., "A 97.8% Efficient GaN HEMT Boost Converter with 300-W Output Power at 1MHz," Electronic Device Letters, 2008, IEEE, 29(8):824-826.
Communication pursuant to Article 94(3) EPC in EP Application No. 09 710 449.1, dated Jan. 8, 2015, 8 pages.
Final Rejection in Japanese Application No. 2014-219833, dated Dec. 6, 2016, 12 pages.
First Examination Report in IN Application No. 5023/CHENP/2010, dated Oct. 4, 2017, 6 pages.
English translation of Notice of Reasons for Rejection in JP Application No. 2017-075617, dated Oct. 31, 2017, 6 pages.

* cited by examiner

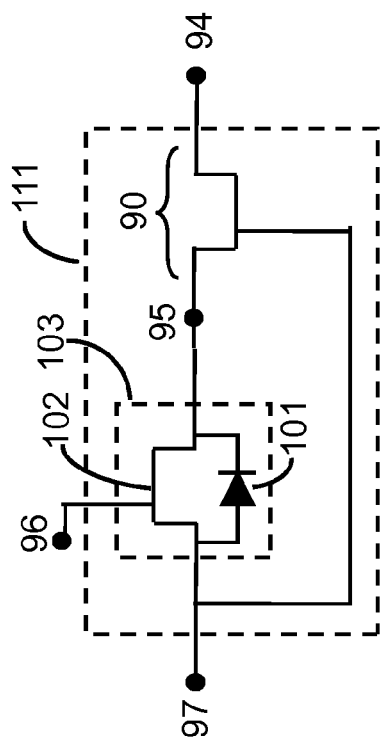
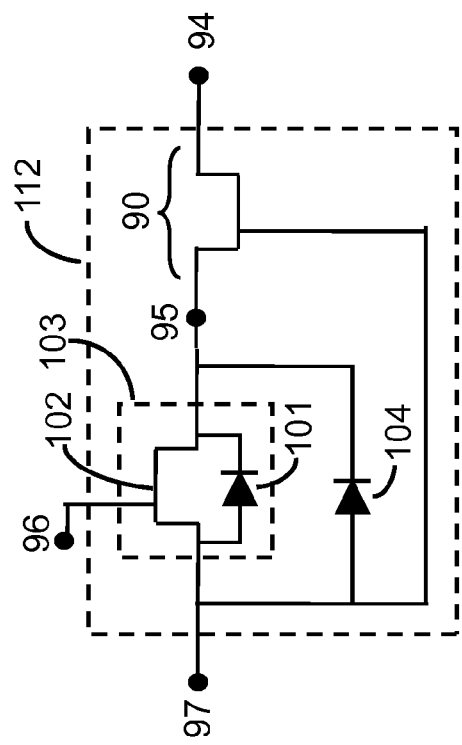

BRIDGE CIRCUITS AND THEIR COMPONENTS

CROSS-REFERENCE TO RELATED APPLICATIONS

This application is a continuation of U.S. application Ser. No. 13/887,204, filed May 3, 2013, which is a continuation of U.S. application Ser. No. 13/164,109, filed Jun. 20, 2011 (now U.S. Pat. No. 8,508,281), which is a continuation of U.S. application Ser. No. 12/368,200, filed Feb. 9, 2009 (now U.S. Pat. No. 7,965,126), which claims the benefit of U.S. Provisional Application No. 61/028,133, filed Feb. 12, 2008. The entire disclosure of each of the prior applications is hereby incorporated by reference.

TECHNICAL FIELD

This invention relates to bridge circuits and the components of which they are comprised.

BACKGROUND

Bridge circuits are used in a wide range of applications. A typical 3-phase bridge circuit for a motor drive is shown in FIG. 1. Each of the three half bridges 15, 25, 35 in circuit 10 includes two switches (61-66), which are able to block current in one direction and are capable of conducting current in both directions. Because the transistors (41-46) commonly used in power circuits are inherently incapable of conducting current in the reverse direction, each of the switches 61-66 in circuit 10 comprises a transistor (41-46) connected anti-parallel to a freewheeling diode 51-56. The transistors 41-46 are each capable of blocking a voltage at least as large as the high voltage (HV) source of the circuit 10 when they are biased in the OFF state, and diodes 51-56 are each capable of blocking a voltage at least as large as the high voltage (HV) source of the circuit 10 when they are reverse biased. Ideally, the diodes 51-56 have good switching characteristics to minimize transient currents during switching, therefore Schottky diodes are commonly used. The transistors 41-46 may be enhancement mode (normally off, $V_{th}>0$), i.e., E-mode, or depletion mode (normally on, $V_{th}<0$), i.e., D-mode devices. In power circuits enhancement mode devices are typically used to prevent accidental turn on in order to avoid damage to the devices or other circuit components. Nodes 17, 18, and 19 are all coupled to one another via inductive loads, i.e., inductive components such as motor coils (not shown in FIG. 1).

FIG. 2a shows half bridge 15 of the full 3-phase motor drive in FIG. 1, along with the winding of the motor (inductive component 21) between nodes 17 and 18 and the switch 64 which the motor current feeds into. For this phase of power, transistor 44 is continuously on ($V_{gs44}>V_{th}$) and transistor 42 is continuously off ($V_{gs42}<V_{th}$, i.e., $V_{gs42}=0V$ if enhancement mode transistors are used), while transistor 41 is modulated with a pulse width modulation (PWM) signal to achieve the desired motor current. FIG. 2b, which is a simplified version of the diagram in FIG. 2a, indicates the path of the current 27 during the time that transistor 41 is biased on. For this bias, the motor current flows through transistors 41 and 44, while no current flows through switch 62 because transistor 42 is biased off and diode 52 is reverse biased. Referring to FIG. 2c, during the time that transistor 41 is biased off, no current can flow through transistor 41 or diode 51, and so the motor current flows through diode 52. During this portion of operation, the inductive component 21 forces the voltage at node 17 to a sufficiently negative value to cause diode 52 to conduct.

Currently, insulated gate bipolar transistors (IGBTs) are typically used in high power bridge circuits, and silicon MOS transistors, also known as MOSFETs, are used in low power applications. Traditional IGBTs inherently conduct in only one direction, and so a freewheeling diode is required for proper operation of a switch with an IGBT. A standard MOS transistor inherently contains an anti-parallel parasitic diode. As seen in FIG. 3a, if the gate and source of a MOS device 50 are biased at the same voltage and the drain is biased at a lower voltage, such as occurs in transistor 42 when transistor 41 is off (FIG. 2c), parasitic diode 60 prevents the intrinsic MOS transistor 71 from turning on. Therefore, the path of the reverse current 37 is through the parasitic diode 60. Because the parasitic diode 60 inherently has poor switching characteristics, the parasitic diode 60 experiences large transients when MOS device 50 is switched on or off.

To completely prevent turn on of the parasitic diode 60, the 3-component solution illustrated in FIG. 3b is often employed. In FIG. 3b, diode 69 is added to the switch to prevent any current from flowing through the parasitic diode 60, and a Schottky diode 68 is added to carry the current during the time that current flows in the direction shown in FIG. 3b, i.e., from the source side to the drain side of MOS device 50.

SUMMARY

A half bridge comprising at least one transistor having a channel that is capable in a first mode of operation of blocking a substantial voltage in at least one direction, in a second mode of operation of conducting substantial current in the at least one direction through the channel and in a third mode of operation of conducting substantial current in an opposite direction through the channel is described.

A method of operating a circuit comprising a half bridge circuit stage comprising a first transistor, a second transistor, and an inductive component, wherein the inductive component is coupled between the first transistor and second transistor, the first transistor is between a voltage source and the second transistor, and the second transistor is between a ground and the first transistor is described. The first transistor is biased on and the second transistor is biased off, allowing current to flow through the first transistor and the inductive component and blocking voltage across the second transistor. The first transistor is changed to an off bias, allowing the current to flow through the second transistor and the inductive component and causing the second transistor to be in diode mode.

A method of operating a circuit comprising an inductive component and a half bridge comprising a first transistor and a second transistor, wherein the inductive component is coupled between the first transistor and second transistor and the first transistor is coupled to a voltage source and the second transistor is coupled to ground is described. The first transistor is biased off and the second transistor is biased on, allowing current to run through the inductive component and through the second transistor, wherein the first transistor blocks a first voltage. The second transistor is changed to an off bias, causing the first transistor to operate in a diode mode to carry freewheeling current and the second transistor to block a second voltage.

Embodiments of the devices and methods described herein can include one or more of the following. The half bridge can include at least two transistors and each transistor can be configured to perform as a switching transistor and as an anti-parallel diode. A bridge circuit can be formed of the half bridges described herein. A gate drive circuit can be configured to independently control a gate voltage of each of the transistors. The transistor can be a first transistor of a bridge component, the bridge component can further include a second transistor. A gate of the first transistor can be electrically connected to a source of the second transistor and a source of the first transistor can be electrically connected to a drain of the second transistor. The first transistor can be a depletion mode device and the second transistor can be an enhancement mode device. The first transistor can be a high voltage device and the second transistor can be a low voltage device. The first transistor can be configured to block a voltage at least equal to a circuit high voltage. The second transistor can be configured to block a voltage at least equal to a threshold voltage of the first transistor. The second transistor can be configured to block a voltage of about two times the threshold voltage. The first transistor can be a high voltage depletion mode transistor and the second transistor can be a low voltage enhancement mode transistor. The first transistor can be a III-N HEMT or a SiC JFET. The second transistor can be a III-N HEMT. The second transistor can be a nitrogen face III-N HEMT. The second transistor can be a silicon based or SiC based device. The second transistor can be a vertical silicon MOSFET or a SiC JFET or a SiC MOSFET. The half bridge can include at least two of the bridge components. The second transistor can include a parasitic diode and the half bridge can include a low voltage diode connected in parallel to the parasitic diode. The low voltage diode can be configured to block at least as much voltage as the second transistor. The low voltage diode can have a lower turn-on voltage than the parasitic diode. The half bridge can include a low voltage diode, wherein the low voltage diode is configured to block a maximum voltage that is less than a circuit high voltage. A half bridge can consist of two transistors, wherein the transistors are each a FET, HEMT, MESFET, or JFET device. The two transistors can be enhancement mode transistors. The transistors can be enhancement mode III-N transistors or SiC JFET transistors. The transistors can be nitrogen face III-N HEMTs. The two transistors can have a threshold voltage of at least 2V. The two transistors can have an internal barrier from source to drain of 0.5 to 2 eV. The two transistors can have an on resistance of less than 5 mohm-cm$^2$ and a breakdown voltage of at least 600V. The two transistors can have an on resistance of less than 10 mohm-cm$^2$ and a breakdown voltage of at least 1200V. A node can be between the two transistors of each half bridge and each of the nodes can be coupled to one another by way of an inductive load. A bridge circuit including the half bridges described herein can be free of diodes. The half bridge can be free of diodes. The second transistor can be changed to an on bias after changing the first transistor to an off bias. The time between the step of changing the first transistor to an off bias and changing the second transistor to an on bias can be sufficient to prevent shoot-through currents from the high-voltage supply to ground. The time between the step of changing the second transistor to an off bias and changing the first transistor to an on bias can be sufficient to prevent shoot-through currents from the high-voltage supply to ground.

The devices and methods described herein may provide one or more of the following advantages. A switch can be formed with only a single transistor device. The transistor device can perform as either a switching transistor or as a diode. The transistor's ability to perform the dual roles can eliminate the need for a separate anti-parallel diode in the switch. A switch including only a single transistor is a simpler device than devices that also require a diode to carry freewheeling current. The device may be operated in a manner that keeps power dissipation to a minimum. Further, the timing and bias on the transistors can allow a device, such as a motor, formed of half bridges using single-device switches to operate in a manner that reduces the total power loss while simultaneously avoiding shoot-through currents from a high-voltage supply to ground.

DESCRIPTION OF DRAWINGS

FIGS. 7-9 show schematic diagrams of switches that can be used in the bridge circuit of FIG. 4.

Like reference symbols in the various drawings indicate like elements.

DETAILED DESCRIPTION

Figure 4:
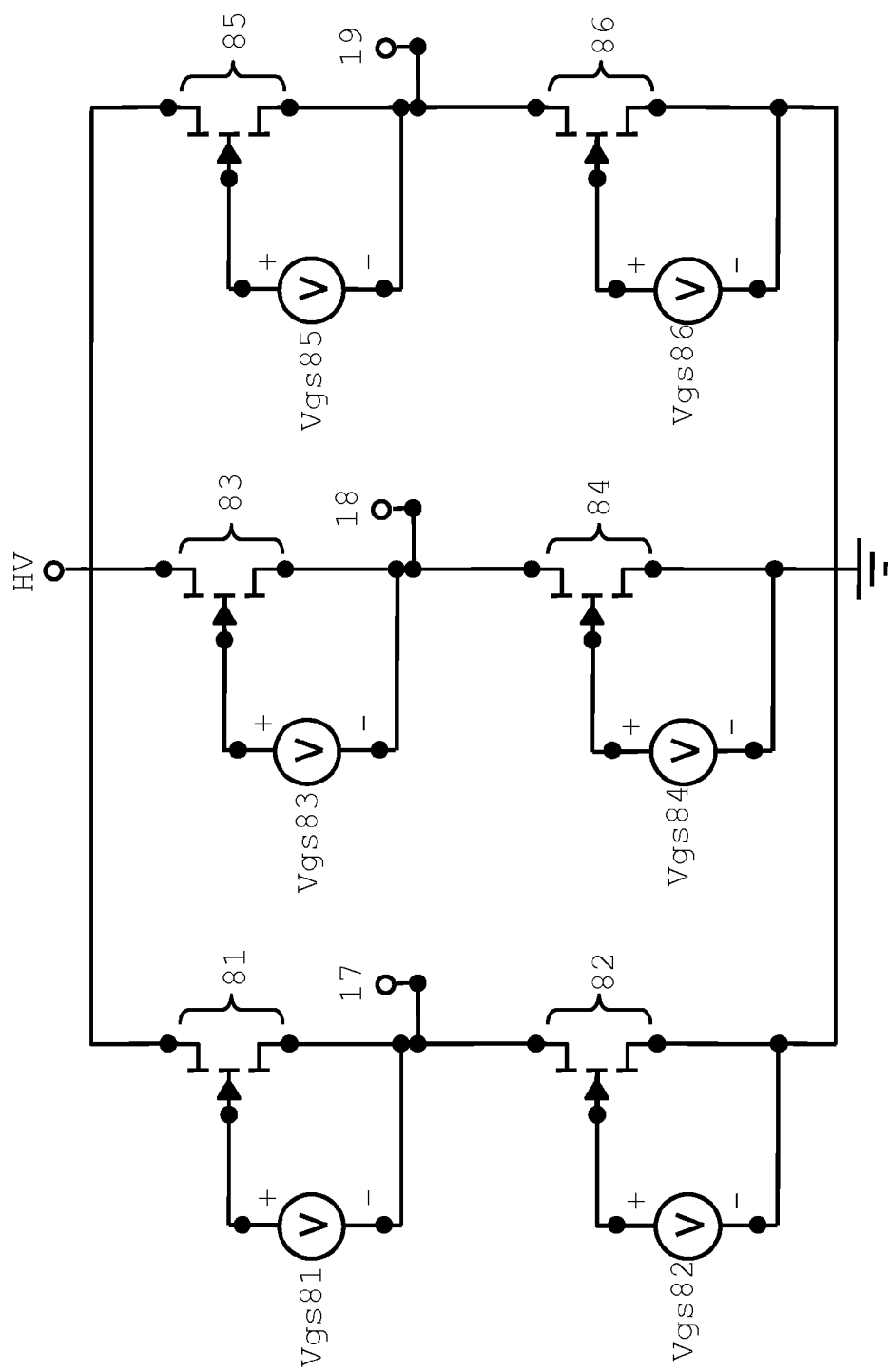
FIG. 4 shows a schematic diagram of a bridge circuit with single device switches.

FIG. 4 shows a schematic diagram of a bridge circuit, where each of the six switches includes a single transistor device (81-86). The transistors 81-86 can be enhancement mode devices, where the threshold voltage $V_{th}>0$, or depletion mode devices, where the threshold voltage $V_{th}<0$. In high power applications, it is desirable to use enhancement mode devices with threshold voltages as large as possible, such as $V_{th}>2V$ or $V_{th}>3V$, a high internal barrier from source to drain at 0 bias (such as 0.5-2 eV), and a high access region conductivity (such as sheet resistance <750 ohms/square) along with high breakdown voltage (600/1200 Volts) and low on resistance (<5 or <10 mohm-cm$^2$ for 600/1200 V respectively). The gate voltages $V_{gs81}$-$V_{gs86}$ are each independently controlled by a gate drive circuit. The devices 81-86 are each able to block current from flowing when the voltage at the terminal closest to ground is lower than the voltage at the terminal closest to the DC high voltage source. In some embodiments, the devices are able to block current in both directions. The devices 81-86 are also each capable of conducting current in both directions through the same conduction path/channel. Nodes 17, 18, and 19 are all coupled to one another via inductive loads, i.e., inductive components such as motor coils (not shown in FIG. 4).

Figure 5A:
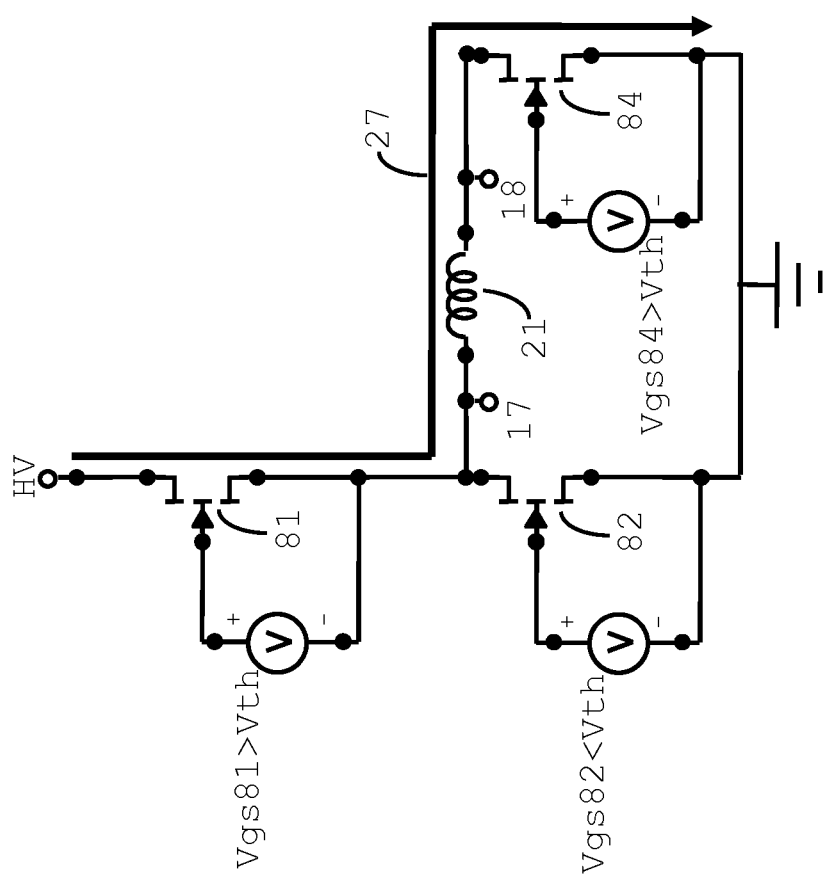
FIGS. 5*a-d* shows schematics of current paths through single transistor switches.
Figure 5B:
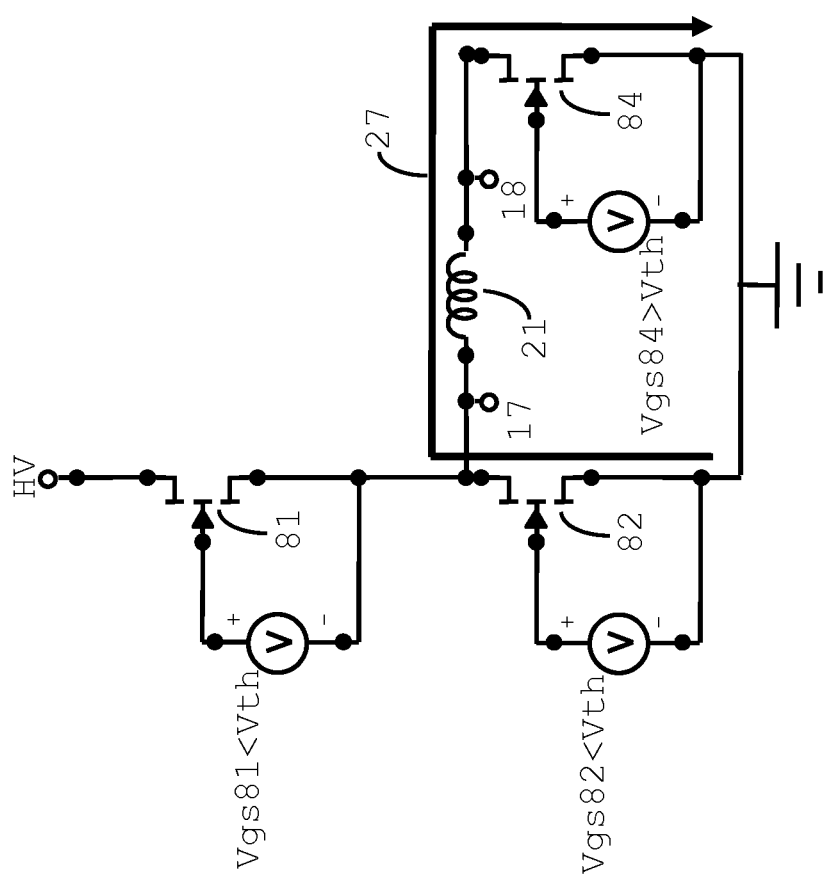

FIGS. 5*a* and 5*b* illustrate the operation of one of the three half-bridges of the circuit in FIG. 4 for a bridge circuit comprising enhancement mode devices which fulfill the requirements described above. For the purpose of this example, the devices are assumed to have a threshold voltage $V_{th}=2V$. Device 84 is continuously biased on, such as by setting $V_{gs84}>V_{th}$, such as $V_{gs84}=5V$. Device 82 is continuously biased off, such as by setting $V_{gs82}<V_{th}$, such as $V_{gs82}=0V$. As shown in FIG. 5*a*, during the time that device 81 is biased on, such as by setting $V_{gs81}>V_{th}$, such as $V_{gs81}=5V$, the current flows along current path 27 through device 81, through the inductive component (motor coil) 21, and through device 84. During this time the voltage at node 17 is higher than the voltage at the source of device 82 but never exceeds a high voltage (HV) value from the high-voltage supply to the circuit. Device 82 is biased off and therefore blocks a voltage $V_a$ across it, where $V_a$ is the voltage at node 17. As used herein, "blocking a voltage" refers to the ability of a transistor to prevent significant current, such as current that is greater than 0.001 times the operating current during regular conduction, from flowing through the transistor when a voltage is applied across the transistor. In other words, while a transistor is blocking a voltage that is applied across it, the total current passing through the transistor will not be greater than 0.001 times the operating current during regular conduction.

FIG. 5b illustrates the current path 27 during the time that device 81 is turned off, such as by setting $V_{gs81}<V_{th}$, such as $V_{gs81}=8V$. During this time the motor current flows through the channel of device 82, through the inductive component (motor coil) 21, and through device 84. Because the gate and source terminals of device 82 are both at 0V, when current flows through device 82 in this direction, device 82 effectively acts as a diode and is said to be in "diode mode". That is, device 82 conducts current in the direction shown in FIG. 5b even when the gate of device 82 is biased below the threshold voltage of device 82, thus it behaves in the same way as a traditional transistor equipped with a reverse free-wheeling diode. The voltage $V_a$ at node 17 is negative, approximately a threshold voltage ($V_{th}$) below the source voltage of device 82, and device 81 must now block a voltage $HV+V_{th}$. Note that current/voltage blocking in one direction and diode action in the opposite direction is achieved with the same device (82).

Figure 1:
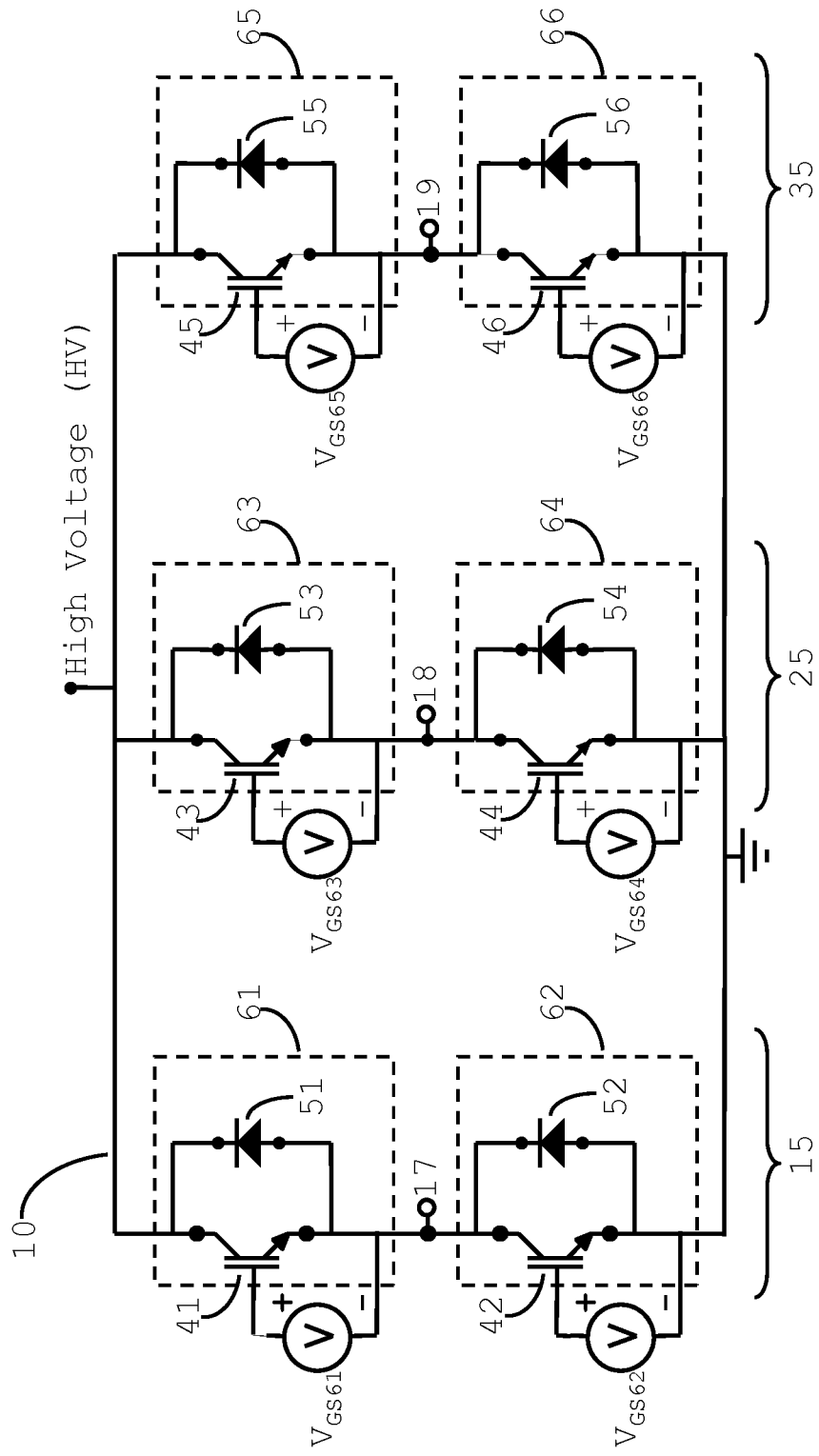
FIG. 1 is a schematic of a 3-phase bridge circuit.
Figure 2A:
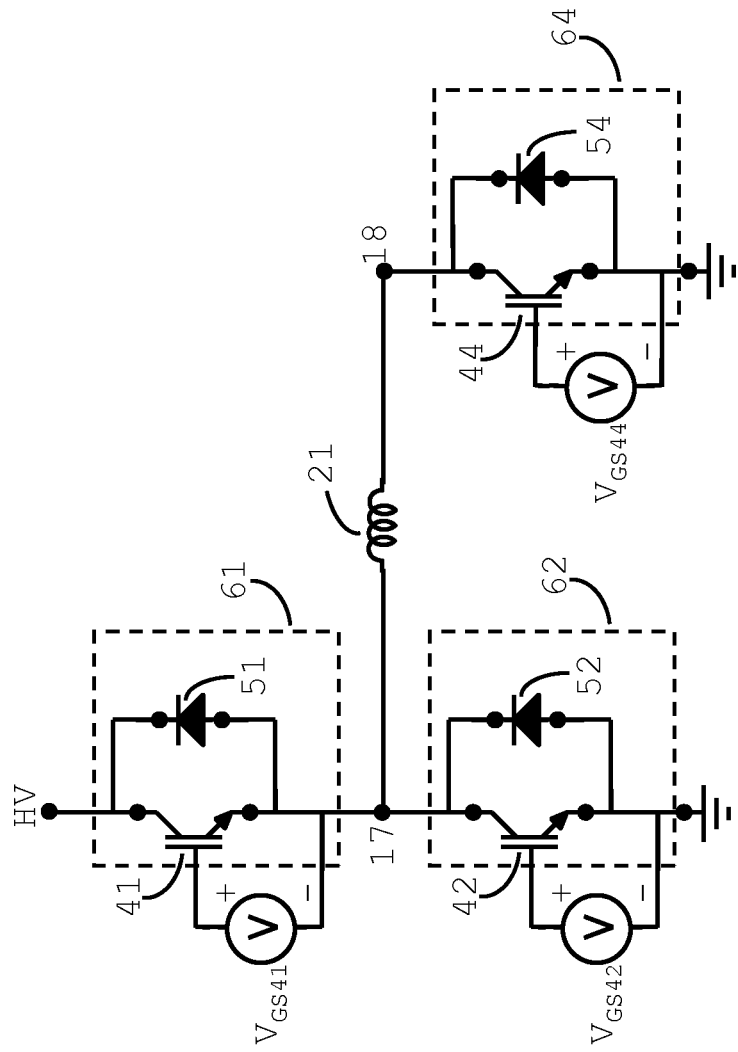
FIGS. 2*a-c* shows schematics and current paths when the 3-phase bridge circuit is powered.
Figure 2B:
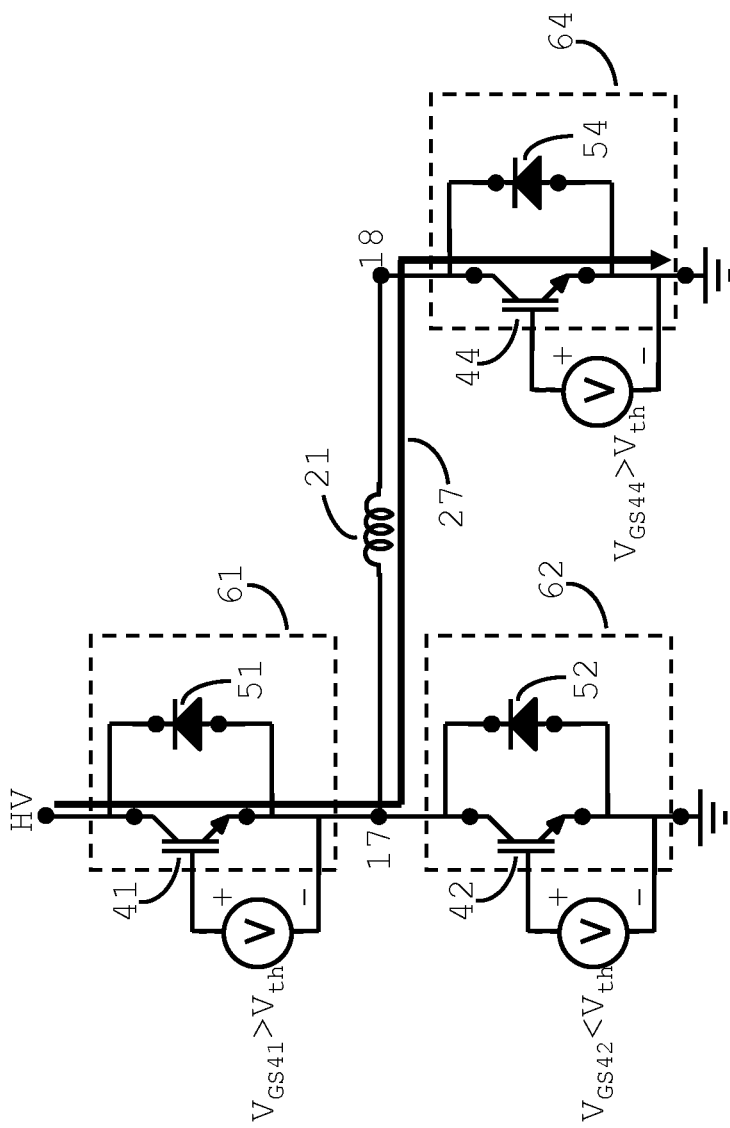
Figure 2C:
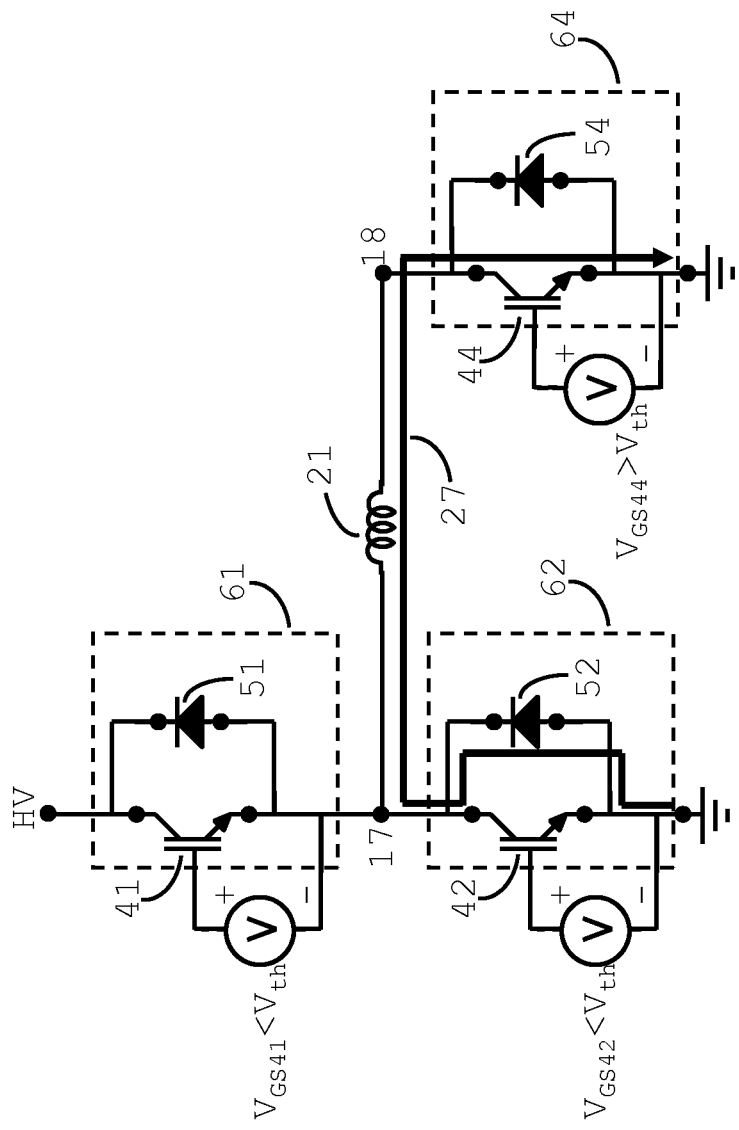
Figure 3B:
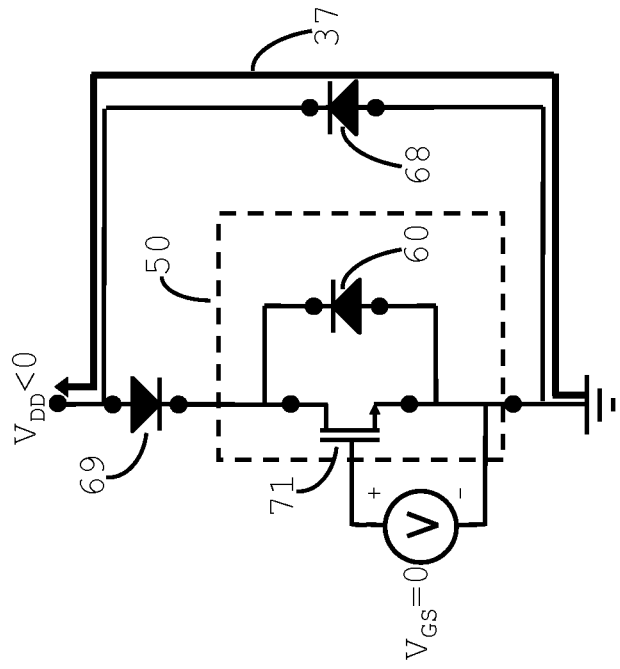
FIGS. 3*a-b* shows schematics of MOS devices and their current paths.
Figure 3A:
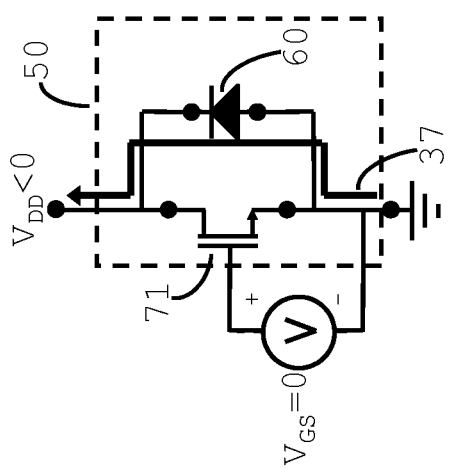
Figure 5C:
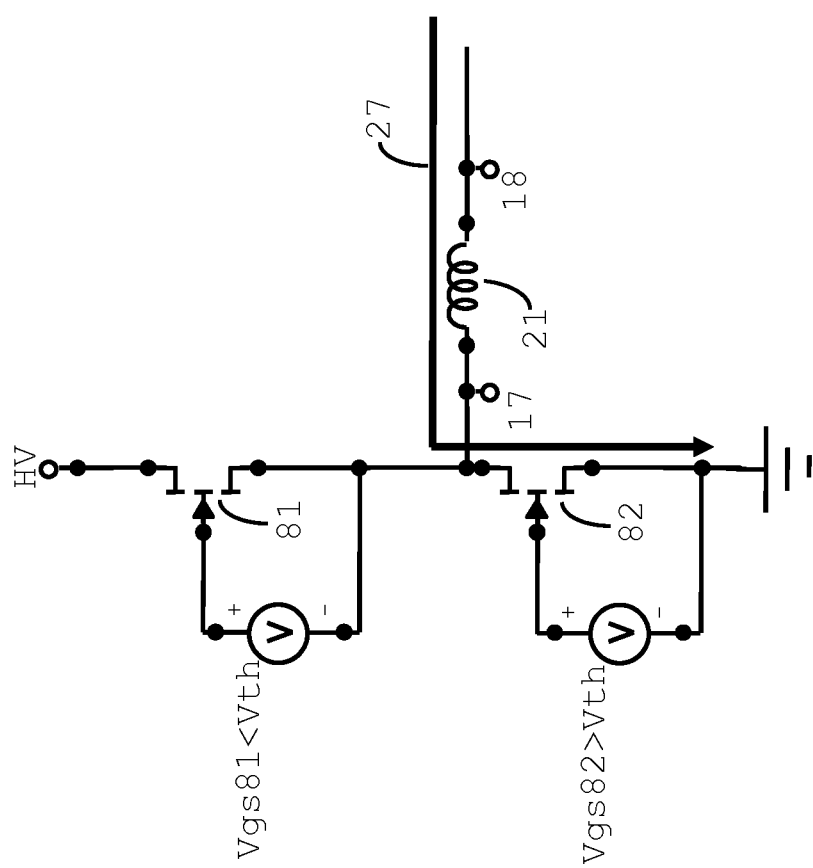
Figure 5D:
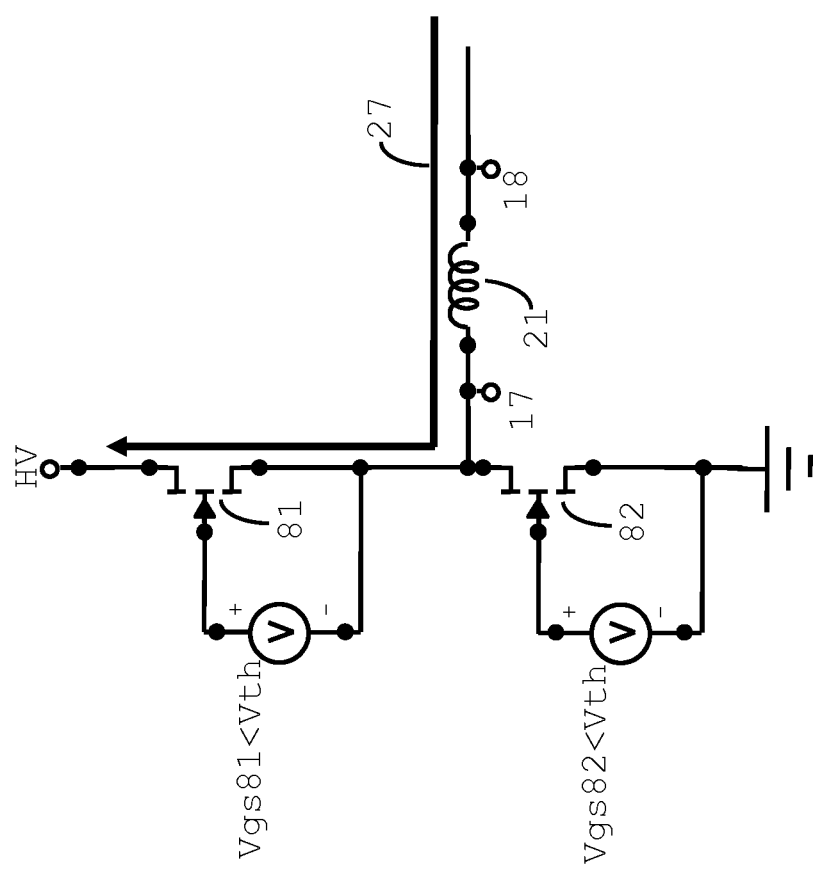

Device 82 can be used as an actively switched device to achieve current flow in the opposite direction through the inductive component (motor coil) 21, as shown in FIGS. 5c and 5d. When device 82 is on (FIG. 5c), current 27 flows through device 82, and device 81 blocks a voltage $HV-V_a$, and when device 82 is off (FIG. 5d), device 81 operates in the diode mode to carry the freewheeling current, while device 82 blocks a voltage $HV+V_{th}$. Thus, in the full circuit devices 81-86 perform the same function as traditional unidirectional transistors with antiparallel freewheeling diodes (61-66 in FIG. 1).

Figure 6:
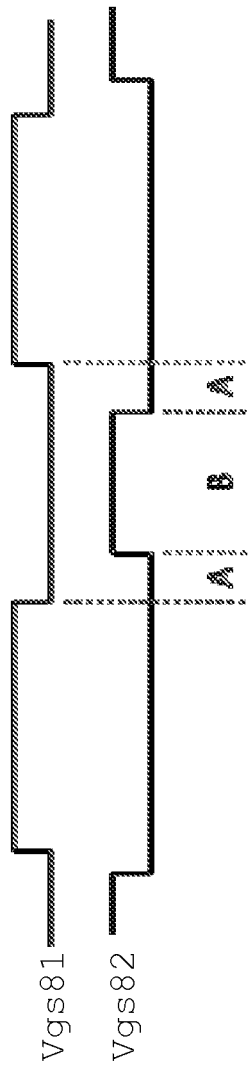
FIG. 6 shows a timing diagram for gate signals.

Depending on the current level and the threshold voltages of devices 81-86 (see FIG. 4), the power dissipation in the devices could be unacceptably high when operating in the diode mode. In this case, a lower power mode of operation may be achieved by applying gate signals of the form shown in FIG. 6. For example, when device 81 is switched as shown in FIGS. 5a and 5b, during the time device 82 conducts the freewheeling current (when device 81 is off), the gate of device 82 is driven high, allowing the drain-source voltage of device 82 to be simply the on-state resistance (Rds-on) times the motor current. To avoid shoot-through currents from the high-voltage supply (HV) to ground, some dead time must be provided between turn-off of device 81 and turn-on of device 82 and again between turn-off of device 82 and turn-on of device 81. The dead times are labeled "A" in FIG. 6. During these dead times, device 82 operates in the diode mode described above. Since this is a short time in comparison with the entire switching cycle, the power dissipation is not significant. Time "B" provides the dominant loss factor for device 82, and this corresponds to the low-power mode when device 82 is fully enhanced.

Referring back to FIG. 4, the diode mode of operation of devices 81-86 provides a current path at all times for the inductor current. Even if transient currents and realistic impedances are considered, the circuit will operate as desired. If, for example, the gate-drain capacitance of devices 81-86 and the source resistance of the gate drive circuit are nonzero, the high slew rate at node 17 will force the potential at the gate of device 82 below ground during the fall time of $V_a$. The result will simply be that $V_a$ is driven by the inductive component 21 to an even lower voltage than in the ideal case, but device 82 will conduct.

The devices 81-86 can be any transistor which can conduct a substantial current, such as a current at least as large as the maximum operating current of the circuit in which they are used, in both directions through the same primary channel and is capable of blocking a substantial voltage, such as a voltage larger than the circuit DC high voltage HV, in at least one direction. Each device must be capable of blocking a voltage in at least one direction which is at least between zero volts and a voltage larger than the HV, such as HV+1V, HV+5V, or HV+10V. The value of HV, and thus the range of voltages that the device must be capable of blocking, depends on the specific circuit application. For example, in some low power applications, HV may be 10V, and the devices are each at least capable of blocking voltages between 0V and 10V, as well as a voltage larger than 10V, such as 11V, 20V, or 30V. In some high power applications, HV may be 1000V, and so the devices are each at least capable of blocking all voltages between 0V and 1000V, as well as a voltage larger than 1000V, such as 1100V, 1150V, or 1200V. Thus, selecting a suitable transistor capable of blocking a sufficient amount of voltage can depend on the application of the circuit. A transistor that is able to block a sufficient amount of current may allow some small amount of current to leak through the primary channel or other parts of the device than the primary channel. However, the transistor may be able to block a sufficient amount of current, which is a significant percentage of the maximum current which passes through the transistor during regular operation, such as >90%, >95%, >99% or >99.9% of the maximum current.

Examples of devices that meet these criterion are metal-semiconductor field effect transistors (MESFETs) of any material system, junction field effect transistors (JFETs) of any material system, and high electron mobility transistors (HEMTs or HFETs) of any material system, including vertical devices such as current aperture vertical electron transistors (CAVETs) as well as devices in which the channel charge has a 3-dimensional distribution, such as polarization-doped field effect transistors (POLFETs). Common material systems for HEMTs and MESFETs include $Ga_xAl_yIn_{1-x-y}N_mAs_nP_{1-m-n}$ or III-V materials, such as III-N materials, III-As materials, and III-P materials. Common materials for JFETs include III-V materials, SiC, and Si, i.e, silicon that is substantially free of carbon. In some embodiments, the devices are enhancement mode devices (threshold voltage $V_{th}>0$), while in others they are depletion mode devices ($V_{th}<0$).

In some embodiments, the devices 81-86 consist of enhancement mode III-nitride (III-N) devices with threshold voltages as large as possible, such as $V_{th}>2V$ or $V_{th}>3V$, a high internal barrier from source to drain at 0 bias (such as 0.5-2 eV), and a high access region conductivity (such as sheet resistance <750 ohms/square) along with high breakdown voltage (at least 600 or 1200 Volts) and low on resistance (<5 or <10 mohm-cm$^2$ for 600/1200 V, respectively). In some embodiments, the devices are nitrogen-face III-N HEMTs, such as those described in U.S. Pat. Nos. 7,915,643 and 7,851,825, both of which are hereby incorporated by reference. The devices can also include any of the following: a surface passivation layer, such as SiN, a field plate, such as a slant field plate, and an insulator underneath the gate. In other embodiments, the devices consist of SiC JFETs.

Figure 7:
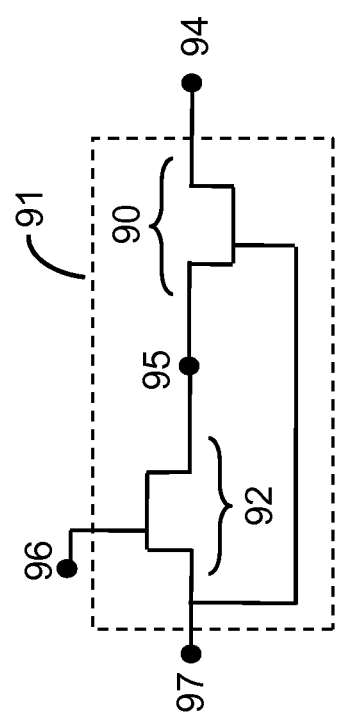

In some embodiments, device 91, illustrated in FIG. 7, is used in a half bridge or a bridge circuit in place of any or all of the devices 81-86 of FIG. 4. Device 91 includes a low-voltage E-mode transistor 92, such as a III-N E-mode transistor, connected as shown to a high voltage D-mode transistor 90, such as a III-N D-mode transistor. In some embodiments, E-mode transistor 92 is a nitrogen-face III-N device, and D-mode transistor 90 is a III-face III-N device. When E-mode transistor 92 conducts current in either direction, substantially all of the current conducts through the same primary device channel of the transistor 92. The gate of D-mode transistor 90 is electrically connected to the source of E-mode transistor 92, and the source of D-mode transistor 90 is electrically connected to the drain of E-mode transistor 92. In some embodiments, the gate of D-mode transistor 90 is not directly connected to the source of E-mode transistor 92. Instead, the gate of D-mode transistor 90 and the source of E-mode transistor 92 are each electrically connected to opposite ends of a capacitor. The device 91 in FIG. 7 can operate similarly to a single high-voltage E-mode transistor with the same threshold voltage as that of E-mode transistor 92. That is, an input voltage signal applied to node 96 relative to node 97 can produce an output signal at node 94 which is the same as the output signal produced at the drain terminal of an E-mode transistor when an input voltage signal is applied to the gate of the E-mode transistor relative to its source. Nodes 97, 96, and 94 are hereby referred to as the source, gate, and drain, respectively, of device 91, analogous to the terminology used for the three terminals of a single transistor. When device 91 is in blocking mode, most of the voltage is blocked by the D-mode transistor 90, while only a small portion is blocked by E-mode transistor 92, as is described below. When device 91 conducts current in either direction, substantially all of the current conducts both through the channel of E-mode transistor 92 and the channel of D-mode transistor 90.

Device 91 in FIG. 7 operates as follows. When node 94 is held at a higher voltage than node 97, current flows from node 94 to node 97 when a sufficiently positive voltage (i.e., a voltage greater than the threshold voltage of E-mode transistor 92) is applied to node 96 relative to node 97, the current flowing both through the channel of E-mode transistor 92 and the channel of D-mode transistor 90. When the voltage at node 96 relative to node 97 is switched to a value less than the threshold voltage of E-mode transistor 92, such as 0 V, device 91 is in blocking mode, blocking the voltage between nodes 97 and 94, and no substantial current flows through device 91. If the voltage at node 94 is now switched to a value less than that at nodes 97 and 96, which are being held at the same voltage, device 91 switches into diode mode, with all substantial current conducting both through the channel of E-mode transistor 92 and the channel of D-mode transistor 90. When a high voltage (HV) is applied to node 94 relative to node 97, and node 96 is biased at 0 V relative to node 97, E-mode transistor 92 blocks a voltage which is about equal to $|V_{th90}|$ or slightly larger, where $|V_{th90}|$ is the magnitude of the threshold voltage of D-mode transistor 90. A value for $V_{th90}$ can be about −5 to −10 V. The voltage at node 95 is therefore about equal to $|V_{th90}|$ or slightly larger, therefore D-mode transistor 90 is in the OFF state and blocks a voltage which is equal to about HV minus $|V_{th90}|$, i.e., D-mode transistor 90 blocks a substantial voltage. When a positive voltage is applied to node 94 relative to node 97, and node 96 is biased at a voltage greater than the threshold voltage of E-mode transistor 92 $V_{th,92}$, such as $2*V_{th,92}$, current flows from node 94 to node 97 both through the channel of E-mode transistor 92 and through the channel of D-mode transistor 90, and the voltage drop $V_F$ across E-mode transistor 92 is much less than $|V_{th90}|$, such as less than about 0.2 V. Under these conditions, the voltage at node 95 relative to node 97 is $V_F$, and the gate-source voltage $V_{GS90}$ of D-mode transistor 90 is about $-V_F$.

The D-mode transistor 90 can be a high voltage device capable of blocking large voltages, such as at least 600V or at least 1200V or other suitable blocking voltage required by the circuit applications. The D-mode transistor is at least capable of blocking a substantial voltage, such as a voltage larger than the circuit DC high voltage HV, when device 91 is in blocking mode, as described above. Furthermore, the threshold voltage $V_{th90}$ of D-mode transistor 90 is sufficiently less than $-V_F$ such that when the assembly is in the ON state, D-mode transistor 90 conducts the current flowing from node 94 to node 97 with sufficiently low conduction loss for the circuit application in which it is used. Thus, the gate-source voltage of D-mode transistor 90 is sufficiently larger than $V_{th90}$ such that conduction losses are not too large for the circuit applications. For example, $V_{th90}$ can be less than −3V, −5V, or −7V, and when the gate-source voltage $V_{GS90}$ of D-mode transistor 90 is about $-V_F$, D-mode transistor 90 is capable of conducting 10 A of current or more with less than 7 W conduction loss.

E-mode transistor 92 is at least capable of blocking a voltage larger than $|V_{th90}|$, where $|V_{th90}|$ is the magnitude of the threshold voltage of D-mode transistor 90. In some embodiments, E-mode transistor 92 can block about $2*|V_{th90}|$. High voltage D-mode III-N transistors, such as III-N HEMTs, or SiC JFETs, can be used for D-mode transistor 90. Because the typical threshold voltage for high voltage D-mode III-N transistors is about −5 to −10 V, E-mode transistor 92 can be capable of blocking about 10-20 V or more. In some embodiments, E-mode transistor 92 is a III-N transistor, such as a III-N HEMT. In other embodiments, E-mode transistor 92 is a SiC transistor, such as a SiC JFET.

When device 91 in FIG. 7 is used in place of devices 81-86 in the bridge circuit of FIG. 4, the circuit operates as follows. Devices 81-86 will be referred to as 81'-86' when device 91 is used in place of these devices. In some embodiments, all of the devices 81'-86' are the same as one another. Even if the device are not all the same, they each have a threshold voltage greater than 0. Referring to the switching sequence shown in FIGS. 5a and 5b, when the gate-source voltages of devices 81' and 84' are greater than the threshold voltage of E-mode transistor 92, and the gate-source voltage of device 82' is less than the threshold voltage of E-mode transistor 92, such as 0 V, the current flows through the channels of both transistors of device 81' and through the channels of both transistors of device 84' from the high voltage source to ground. Device 82' blocks a voltage $V_a$, where again $V_a$ is the voltage at node 17. Referring to FIG. 5b, when device 81' is switched off, the inductive component 21 forces $V_a$, the voltage at node 17, to a negative value and device 81' now blocks a voltage HV minus $V_a$. Device 82' now operates in diode mode, with current flowing through device 82' from ground to node 17. Substantially all of the current through device 82' conducts both through the channel of E-mode transistor 92 and the channel of D-mode transistor 90. When the bridge circuit is operated under the conditions shown in FIG. 5c, that is, when current flows through inductive component from node 18 to node 17, device 81' is switched off, and the gate-source voltage of device 82' is greater than the threshold voltage of E-mode transistor 92, current flows through device 82' from node 17 to ground. Substantially all of the current through device 82' conducts both through the channel of E-mode transistor 92 and the channel of D-mode transistor 90.

Thus, for the mode of operation shown in FIG. 5*a*, the D-mode transistor in device 82' blocks a substantial voltage, for the mode of operation shown in FIG. 5*b*, the D-mode transistor of device 82' conducts a substantial current flowing from source to drain through its channel, and for the mode of operation shown in FIG. 5*c*, the D-mode transistor of device 82' conducts a substantial current flowing from drain to source through its channel.

Referring back to FIG. 7, when device 91 operates in diode mode, the voltage at node 95 must be less than that at node 97. Therefore, the gate of D-mode transistor 90 is at a higher voltage than the source of D-mode transistor 90, and the channel of D-mode transistor 90 is enhanced. However, depending on the current level and the threshold voltage of E-mode transistor 92, the power dissipation in the E-mode transistor 92 could be unacceptably high when devices 81'-86' operate in the diode mode. In this case, a lower power mode of operation can be achieved by applying gate signals of the form shown in FIG. 6. For example, when device 81' is switched as shown in FIGS. 5*a* and 5*b*, during the time device 82' conducts the freewheeling current (when device 81' is off), the gate of device 82' is driven high, allowing the drain-source voltage of device 82' to be simply the effective on-state resistance (Rds-on) of device 82' times the motor current. To avoid shoot-through currents from the high-voltage supply (HV) to ground, some dead time must be provided between turn-off of device 81' and turn-on of device 82' and again between turn-off of device 82' and turn-on of device 81'. The dead times are labeled "A" in FIG. 6. During these dead times, device 82' operates in the diode mode described above. Since this is a short time in comparison with the entire switching cycle, the power dissipation is not significant. Time "B" provides the dominant loss factor for device 82', and this corresponds to the low-power mode when E-mode transistor 92 is fully enhanced.

In some embodiments, device 111, illustrated in FIG. 8, is used in a half bridge or a bridge circuit in place of any or all of the devices 81-86 of FIG. 4. Device 111 is similar to device 91 of FIG. 7, except that E-mode transistor 92 has been replaced with a low-voltage E-mode transistor, such as a silicon (Si) based vertical Si MOS field-effect transistor (FET) referred to herein as Si MOS transistor 103. In some embodiments, the low-voltage E-mode transistor is a SiC JFET or a SiC MOSFET. Si MOS transistor 103 has the same voltage blocking requirements as E-mode transistor 92 in FIG. 7. That is, Si MOS transistor 103 is at least capable of blocking a voltage larger than $|V_{th90}|$, where $|V_{th90}|$ the magnitude of the threshold voltage of D-mode transistor 90. In some embodiments, Si MOS transistor 103 can block about $2*|V_{th90}|$. High voltage D-mode III-N transistors can be used for D-mode transistor 90. Because the typical threshold voltage for high voltage D-mode III-N transistors is about −5 to −10 V, Si MOS transistor 103 can be capable of blocking about 10-20 V or more.

Si MOS transistors inherently contain a parasitic diode 101 anti-parallel to the intrinsic transistor 102, as indicated in FIG. 8. Si MOS transistor 103 operates in the same way as E-mode transistor 92 when device 111 is in blocking mode as well as during standard forward conduction mode (i.e., when current flows from node 94 to node 97). That is, when a high voltage HV is applied to node 94 relative to node 97 and the gate-source voltage of Si MOS transistor 103 is below threshold, such that device 111 is in blocking mode, Si MOS transistor 103 blocks a voltage which is about equal to $|V_{th90}|$ slightly larger, with the remainder of the high voltage being blocked by D-mode transistor 90, i.e., D-mode transistor 90 blocks a substantial voltage. When the voltage at node 94 is larger than that at node 97 and the gate-source voltage of Si MOS transistor 103 is above threshold, device 111 is in standard forward conduction mode with current flowing from node 94 to node 97. Substantially all of the current conducts through the channel of Si MOS transistor 103 and through the channel of D-mode transistor 90. The voltage difference between node 95 and node 97 is between 0 V and $|V_{th90}|$, where $V_{th90}$ is the threshold voltage of D-mode transistor 90. In this mode of operation, parasitic diode 101 is reverse biased and blocks a voltage less than $|V_{th90}|$.

The operation of Si MOS transistor 103 is different from that of E-mode transistor 92 when device 111 is in diode mode. When device 111 operates in diode mode, the voltage at node 94 is lower than that at node 97, the gate-source voltage of Si MOS transistor 103 is below threshold, and current flows from node 97 to node 94. Under these conditions, the voltage at node 95 must be less than that at node 97. Parasitic diode 101, which is forward biased, turns on and prevents the intrinsic transistor 102 from turning on. Therefore, when device 111 is in diode mode, most of the current flowing through Si MOS transistor 103 flows through parasitic diode 102 rather than through the channel of Si MOS transistor 103. However, substantially all of the current still conducts through the channel of D-mode transistor 90 when device 111 is in diode mode.

When device 111 operates in diode mode, the voltage at node 95 must be less than that at node 97. Therefore, the gate of D-mode transistor 90 is at a higher voltage than the source of D-mode transistor 90, and the channel of D-mode transistor 90 is enhanced. Depending on the current level and the forward conduction characteristics of parasitic diode 101, the power dissipation in the parasitic diode 101 could be unacceptably high when device 111 operates in the diode mode. In this case, a lower power mode of operation can be achieved by applying gate signals of the form shown in FIG. 6. As an example, consider the bridge circuit of FIG. 4, but with each of the devices 81-86 replaced by device 111. In this example, the devices in the bridge circuit are referred to as devices 81"-86". When device 81" is switched as shown in FIGS. 5*a* and 5*b*, during the time device 82" conducts the freewheeling current (when device 81" is off), the gate of device 82" is driven high. This causes the current through Si transistor 103 of device 82" to flow primarily through the enhanced intrinsic transistor 102 rather than through parasitic diode 101, allowing the drain-source voltage of Si transistor 103 to be simply the effective on-state resistance (Rds-on) of Si transistor 103 times the current. To avoid shoot-through currents from the high-voltage supply (HV) to ground, some dead time must be provided between turn-off of device 81" and turn-on of device 82" and again between turn-off of device 82" and turn-on of device 81". The dead times are labeled "A" in FIG. 6. During these dead times, device 82" operates in the diode mode described above, with the current through Si transistor 103 flowing primarily through parasitic diode 101.

In some embodiments, device 112, illustrated in FIG. 9, is used in a half bridge or a bridge circuit in place of any or all of the devices 81-86. Device 112 is similar to device 111 of FIG. 8, but further includes a low voltage, low on-resistance diode 104 connected in parallel to parasitic diode 101. Diode 104 has the same voltage blocking requirements as Si MOS transistor 103. That is, diode 104 is at least capable of blocking a voltage larger than $|V_{th90}|$, where $|V_{th90}|$ is the magnitude of the threshold voltage of D-mode transistor 90. In some embodiments, diode 104 can block about $2*|V_{th90}|$. High voltage D-mode III-N transistors can be used for D-mode transistor 90. Because the typical threshold voltage for high voltage D-mode III-N transistors is about −5 to −10 V, diode 104 can be capable of blocking about 10-20 V or more. Low voltage devices, such as low voltage diodes or transistors, are not capable of blocking high voltages, such as 600V or 1200V, which are applied by the DC power supplies in high voltage circuits. In some embodiments, the maximum voltage that can be blocked by a low voltage diode or low voltage transistor is about 40V, 30V, 20V, or 10V. Furthermore, diode 104 has a lower turn-on voltage than parasitic diode 101. Consequently, when device 112 is biased in diode mode, the current primarily flows through diode 104 rather than through parasitic diode 101. Diodes that can be used for diode 104, such as low voltage Schottky diodes, can have lower switching and conduction losses than parasitic diode 101. Consequently, conduction and switching losses during device operation can be smaller for device 112 than for device 111.

Depending on the current level and the forward conduction characteristics of diode 104, the power dissipation in diode 104 could be unacceptably high when device 112 operates in the diode mode. Again, a lower power mode of operation can be achieved by applying gate signals of the form shown in FIG. 6. When the gate of device 112 is driven high while device 112 conducts the freewheeling current, the current flows primarily through the enhanced intrinsic transistor 102 rather than through diode 104, allowing the drain-source voltage of Si MOS transistor 103 to be simply the effective on-state resistance (Rds-on) of Si MOS transistor 103 times the current.

Although the device 112 in FIG. 9 does contain a diode, the diode does not need to be able to block the entire circuit DC voltage HV, it only needs to block a voltage slightly larger than $|V_{th90}|$. Therefore, low voltage diodes can be used. This can be preferable to using the high voltage diodes which are typically included in bridge circuits, because low voltage diodes can be made to have lower switching and conduction losses than high voltage diodes. Therefore, power loss in the circuit can be reduced as compared to half bridges and bridge circuits in which high voltage diodes are used.

A number of embodiments of the invention have been described. Nevertheless, it will be understood that various modifications may be made without departing from the spirit and scope of the invention. For example, a half bridge can include one switch that uses a single transistor and no diode and a second switch with a transistor and a diode. In some embodiments a half bridge consists of two transistors and does not include any diodes. In some embodiments, instead of current flowing from one half bridge through an inductor and onto a transistor of another half bridge, the current flowing out of the inductor runs to another electrical component, such as a capacitor, or directly to a ground terminal or a DC voltage supply. Accordingly, other embodiments are within the scope of the following claims.

What is claimed is:

1. A method of operating a circuit comprising a first transistor having a single gate, a second transistor having a single gate, and an inductive component, the second transistor comprising a channel and lacking an intrinsic diode anti-parallel to the channel, the method comprising:

biasing the first transistor on and biasing the second transistor off, allowing current to flow through the first transistor and the inductive component and blocking voltage in a first direction across the second transistor;

changing the first transistor to an off bias while leaving the second transistor biased off, allowing the current to flow through the channel of the second transistor in a second direction; and changing the second transistor to an on bias after changing the first transistor to an off bias, wherein the current continues to flow through the channel of the second transistor in the second direction.

2. The method of claim 1, wherein a time between the step of changing the first transistor to an off bias and changing the second transistor to an on bias is sufficient to prevent shoot-through currents from a high-voltage supply to ground.

3. The method of claim 2, further comprising:

changing the second transistor to an off bias after changing the second transistor to an on bias, causing the second transistor to be in diode mode; and after changing the second transistor to an off bias, changing the first transistor to an on bias, allowing the current to flow through the first transistor and blocking voltage across the second transistor.

4. The method of claim 3, wherein the time between the step of changing the second transistor to an off bias and changing the first transistor to an on bias is sufficient to prevent shoot-through currents from the high-voltage supply to ground.

5. The method of claim 1, wherein the first transistor or the second transistor is an enhancement-mode transistor.

6. The method of claim 1, wherein the first transistor or the second transistor is a III-N transistor.

7. The method of claim 1, wherein the first transistor or the second transistor is a III-N HEMT.

8. The method of claim 1, wherein the first transistor and the second transistor are part of a half bridge.

9. The method of claim 1, wherein the first transistor and the second transistor are enhancement-mode III-N transistors.

10. The method of claim 1, wherein the inductive component is coupled between the first transistor and the second transistor, the first transistor is between a voltage source and the second transistor, and the second transistor is between a ground and the first transistor.

11. A method of operating a circuit comprising a first switch formed of a first single transistor having a single gate, a second switch formed of a second single transistor having a single gate and a channel, and an inductive component, the method comprising:

biasing the second transistor on and biasing the first transistor off, allowing current to flow through the channel of the second transistor in a first direction;

biasing the first transistor on and biasing the second transistor off, allowing current to flow through the first transistor and the inductive component, whereby a blocking voltage is present across the second transistor; and after biasing the first transistor on and biasing the second transistor off, changing the first transistor to an off bias, allowing the current to flow through the channel of the second transistor in a second direction and through the inductive component.

12. The method of claim 11, further comprising changing the second transistor to an on bias after changing the first transistor to an off bias, wherein the current continues to flow through the channel of the second transistor in the second direction.

13. The method of claim 12, wherein a time between the step of changing the first transistor to an off bias and changing the second transistor to an on bias is sufficient to prevent shoot-through currents from a high-voltage supply to ground.

14. The method of claim 11, wherein the first switch is a high side switch of a half bridge, and the second switch is a low side switch of the half bridge.

15. A circuit, comprising:
an inductive component coupled to a switching device, the switching device comprising a depletion-mode transistor and an enhancement-mode transistor, the enhancement-mode transistor including a gate, and the depletion-mode transistor including a channel, wherein a gate of the depletion-mode transistor is electrically connected to a source of the enhancement-mode transistor and a source of the depletion-mode transistor is electrically connected to a drain of the enhancement-mode transistor; wherein
the switching device is configured such that in a first mode of operation current flows through the channel of the depletion-mode transistor in a first direction when the gate of the enhancement-mode transistor is biased below a threshold voltage of the enhancement-mode transistor, and in a second mode of operation current flows through the channel of the depletion-mode transistor in the first direction when the gate of the enhancement-mode transistor is biased above the threshold voltage of the enhancement-mode transistor.

16. The circuit of claim 15, wherein the switching device is configured such that in a third mode of operation the depletion-mode transistor blocks voltage applied in a second direction across the switching device.

17. The circuit of claim 16, wherein in the third mode of operation the enhancement-mode transistor blocks a voltage at least equal to an absolute value of a threshold voltage of the depletion-mode transistor.

18. The circuit of claim 16, wherein in the third mode of operation the gate of the enhancement-mode transistor is biased below the threshold voltage of the enhancement-mode transistor.

19. The circuit of claim 15, wherein the depletion-mode transistor is a high-voltage device and the enhancement-mode transistor is a low-voltage device.

20. The circuit of claim 15, wherein the depletion-mode transistor lacks an intrinsic diode anti-parallel to the channel.

21. A method of operating a circuit, the circuit comprising an inductive component coupled to a first switching device and a second switching device, the second switching device comprising a depletion-mode transistor and an enhancement-mode transistor, the enhancement-mode transistor including a gate, the depletion-mode transistor including a channel, wherein a gate of the depletion-mode transistor is electrically connected to a source of the enhancement-mode transistor and a source of the depletion-mode transistor is electrically connected to a drain of the enhancement-mode transistor, the method comprising:
flowing a current through the inductive component;
at a first time, biasing a gate of the first switching device at a voltage lower than a threshold voltage of the first switching device and biasing the gate of the enhancement-mode transistor at a voltage lower than a threshold voltage of the enhancement-mode transistor, causing the first switching device to operate in blocking mode and the second switching device to operate in diode mode, wherein the current flows through the channel of the depletion-mode transistor in a first direction; and
at a second time following the first time, changing the bias on the gate of the enhancement-mode transistor to be higher than the threshold voltage of the enhancement-mode transistor, wherein the current continues to flow through the channel of the depletion-mode transistor in the first direction.

22. The method of claim 21, further comprising at a third time prior to the first time, biasing the gate of the first switching device at a voltage higher than the threshold voltage of the first switching device and biasing the gate of the enhancement-mode transistor at a voltage lower than the threshold voltage of the enhancement-mode transistor, causing the second switching device to operate in blocking mode and allowing the current to flow through the first switching device.

23. The method of claim 22, wherein while the second switching device operates in blocking mode, the enhancement-mode transistor blocks a voltage at least equal to an absolute value of a threshold voltage of the depletion-mode transistor.

24. The method of claim 21, wherein the first and second switching devices are part of a half bridge.

25. The method of claim 21, wherein the depletion-mode transistor is a high-voltage device and the enhancement-mode transistor is a low-voltage device.

26. The method of claim 21, wherein the depletion-mode transistor lacks an intrinsic diode anti-parallel to the channel.

27. A half bridge comprising a switch formed of a single transistor, the single transistor having a single gate, a source, a drain and a channel, wherein the half bridge is configured such that in a first mode of operation the switch blocks a substantial voltage in a first direction, in a second mode of operation the switch conducts substantial current in the first direction through the channel of the transistor, and in a third mode of operation the switch conducts substantial current in an opposite direction through the channel of the transistor, wherein in the third mode of operation the single gate is biased relative to the source at a voltage lower than a threshold voltage of the single transistor.

28. The half bridge of claim 27, wherein the half bridge includes at least two transistors, wherein each transistor has a single gate, and each transistor is configured to perform as a switching transistor and as an anti-parallel diode.

29. A bridge circuit comprising a plurality of half bridges of claim 27.

30. The bridge circuit of claim 29, further comprising a gate drive circuit configured to independently control a gate voltage the single gates of each of the transistors.

31. The half bridge of claim 27, wherein the switch is a first switch, the half bridge consists of the first switch and a second switch, and the second switch is formed of a second single transistor.

32. The half bridge of claim 31, wherein the transistors are enhancement mode transistors.

33. The half bridge of claim 31, wherein the transistors are nitrogen face III-N HEMTs.

34. The half bridge of claim 31, wherein the transistors have a threshold voltage of at least 2V.

35. The half bridge of claim 31, wherein the transistors have an on resistance of less than 5 mohm-cm$^2$ and a breakdown voltage of at least 600V.

36. The half bridge of claim 31, wherein the transistor is an enhancement-mode transistor.

37. The half bridge of claim 27, wherein the transistor comprises a channel and lacks an intrinsic diode anti-parallel to the channel.

38. The half bridge of claim 37, wherein the transistor is an enhancement-mode III-N HEMT.

* * * * *